United States Patent
Hsu et al.

(10) Patent No.: US 6,618,316 B2
(45) Date of Patent: Sep. 9, 2003

(54) PSEUDO-STATIC SINGLE-ENDED CACHE CELL

(75) Inventors: Steven K. Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/027,414

(22) Filed: Dec. 20, 2001

(65) Prior Publication Data

US 2003/0117880 A1 Jun. 26, 2003

(51) Int. Cl.[7] .............................. G11C 8/00; G11C 7/00; G11C 7/02; H03K 19/094; H03K 19/20

(52) U.S. Cl. .......................... 365/230.05; 365/189.05; 365/189.08; 365/214; 326/113; 326/104; 326/105; 326/106

(58) Field of Search ................. 365/230.05, 189.05, 365/214, 189.08; 326/113, 104, 105, 106

(56) References Cited

U.S. PATENT DOCUMENTS

| | | | | | |
|---|---|---|---|---|---|
| 4,730,274 A | * | 3/1988 | Edwards | ............... | 365/185.08 |
| 5,339,271 A | * | 8/1994 | Tanagawa | .............. | 365/185.24 |
| 5,349,558 A | * | 9/1994 | Cleveland et al. | ......... | 365/200 |
| 5,488,318 A | * | 1/1996 | Vajapey et al. | ................ | 326/46 |
| 5,563,842 A | * | 10/1996 | Challa | .................... | 365/230.06 |
| 5,892,726 A | * | 4/1999 | Moon et al. | ........... | 365/230.06 |
| 6,081,136 A | * | 6/2000 | Khanna et al. | ................ | 326/95 |
| 6,094,073 A | * | 7/2000 | Campardo et al. | .......... | 326/105 |
| 6,144,612 A | * | 11/2000 | Numasawa | ............. | 365/230.06 |
| 6,362,658 B1 | * | 3/2002 | Pascucci | ..................... | 326/105 |

FOREIGN PATENT DOCUMENTS

JP        06103774 A    *  4/1994    .......... G11C/11/41

* cited by examiner

Primary Examiner—Hoai Ho
Assistant Examiner—Ly Duy Pham
(74) Attorney, Agent, or Firm—Seth Z. Kalson

(57) ABSTRACT

A cache memory cell comprising a read-access transistor to access the cell, where the read-access transistor is reverse biased when the memory cell is not being read to reduce sub-threshold leakage current.

6 Claims, 3 Drawing Sheets

PSEUDO-STATIC SINGLE-ENDED CACHE CELL

FIELD

Embodiments of the present invention relate to digital circuits, and more particularly, to cache memory cells.

BACKGROUND

As device technology scales to smaller dimensions, sub-threshold leakage current may present problems if circuits are not properly designed. The increase in sub-threshold leakage current may have a negative impact on circuit robustness, particularly for many single-ended caches in which each bit line is shared by a plurality of memory cells.

As an example, a portion of a cache circuit is shown in FIG. 1, where memory cell 102 is connected to local bit line 104. In practice, there will be other local bit lines, as well as other memory cells connected to local bit line 104, but for simplicity, only one local bit line is shown, and only one memory cell is shown connected to local bit line 104. Memory cell 102 comprises cross-coupled static inverters 106 to store binary data, read-pass transistor 108, and read-access transistor 110. For simplicity, a write port is not shown.

During a pre-charge phase, clock signal φ is LOW so that pullup transistor 114 is ON to charge local bit line 104 HIGH. The signal driving the gate of read-access transistor 110, referred to as a read-select signal, is a dynamic signal, so that it is LOW during a pre-charge phase. During an evaluation phase, clock signal φ is HIGH so that pullup transistor 114 is OFF.

Read operations are performed during an evaluation phase. For convenience, the data stored in a memory cell is taken as the logical value of the gate of the corresponding read-pass transistor, so that a logical "1" corresponds to a HIGH gate voltage and a logical "0" corresponds to a LOW gate voltage. Consider the case in which a read operation is performed on memory cell 102. The read-select signal driving read-access transistor 110 is HIGH. Local bit line 104 is pulled LOW if memory cell 102 stores a logical "1". If, however, the stored data is a logical "0", then local bit line 104 will not be pulled LOW by memory cell 102, in which case half-keeper 112 is designed to maintain local bit line 104 HIGH.

Consider a scenario in which all memory cells connected to local bit line 104 store a logical "1". If during an evaluation phase no read operations are performed on the memory cells connected to local bit line 104, then the cumulative effect of sub-threshold leakage current through each read-access transistor may discharge local bit line 104 LOW or close to LOW. Consequently, power must be expended to charge local bit line 104 HIGH during the next pre-charge phase, for otherwise an erroneous read operation may occur in the next evaluation phase.

Consider another scenario in which memory cell 102 stores a logical "0", and all other memory cells connected to local bit line 104 store a logical "1". Furthermore, suppose that during an evaluation phase a read operation is performed on memory cell 102. The cumulative effect of sub-threshold leakage current in the other memory cells connected to local bit line 104 may be sufficient to pull local bit line 104 to LOW, or close enough to LOW, so that the stored data in memory cell 102 is incorrectly read as a logical "1".

For some prior art circuits, half-keeper 112 is sized large enough so that local bit line 104 is not discharged by sub-threshold leakage current. However, a larger half-keeper increases contention when a local bit line is pulled LOW by a memory cell. This contention may degrade the performance of the cache. Furthermore, sub-threshold leakage current causes power to be expended to maintain local bit line 104 HIGH during a pre-charge phase, or to maintain local bit line 104 during an evaluation phase under the second scenario considered above.

DESCRIPTION OF EMBODIMENTS

Figure 1:
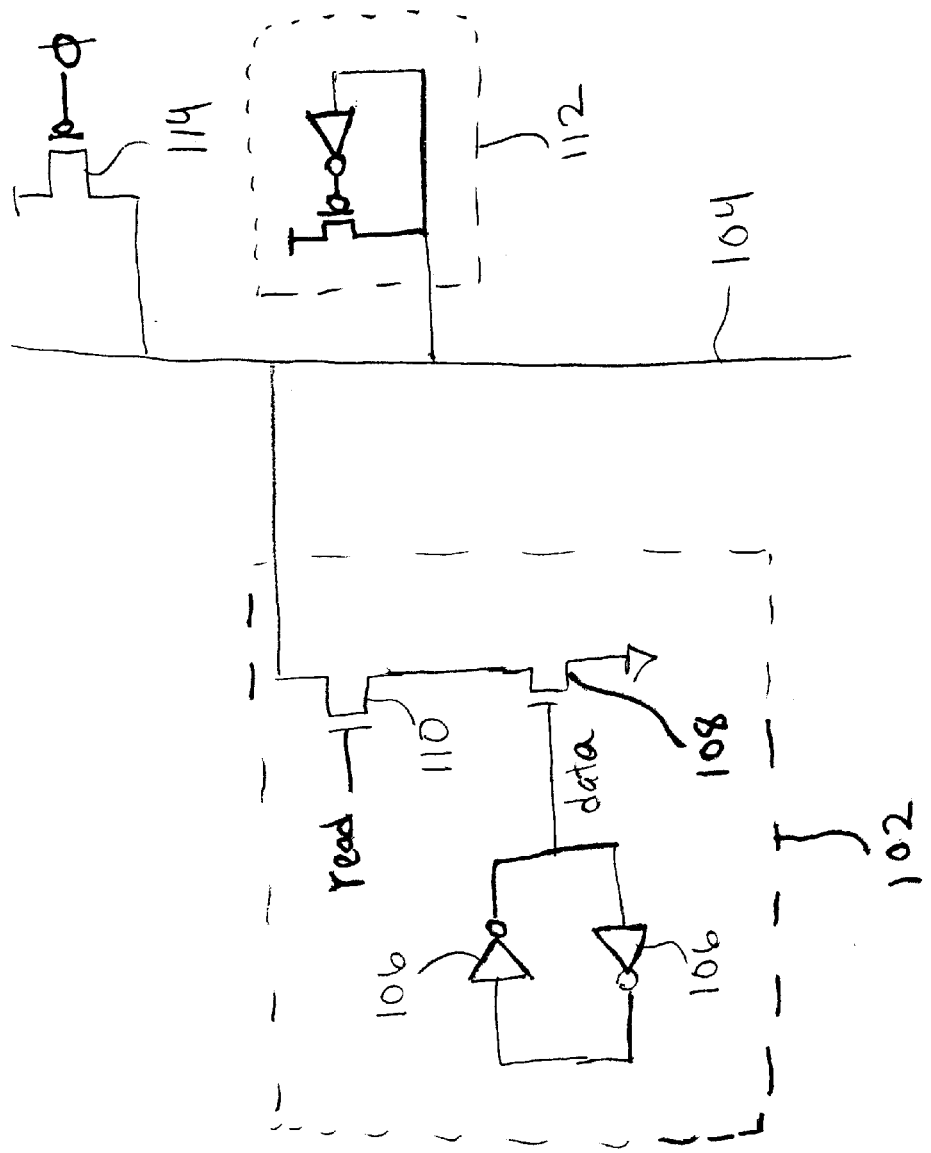
FIG. 1 is a prior art cache memory cell.
Figure 2:
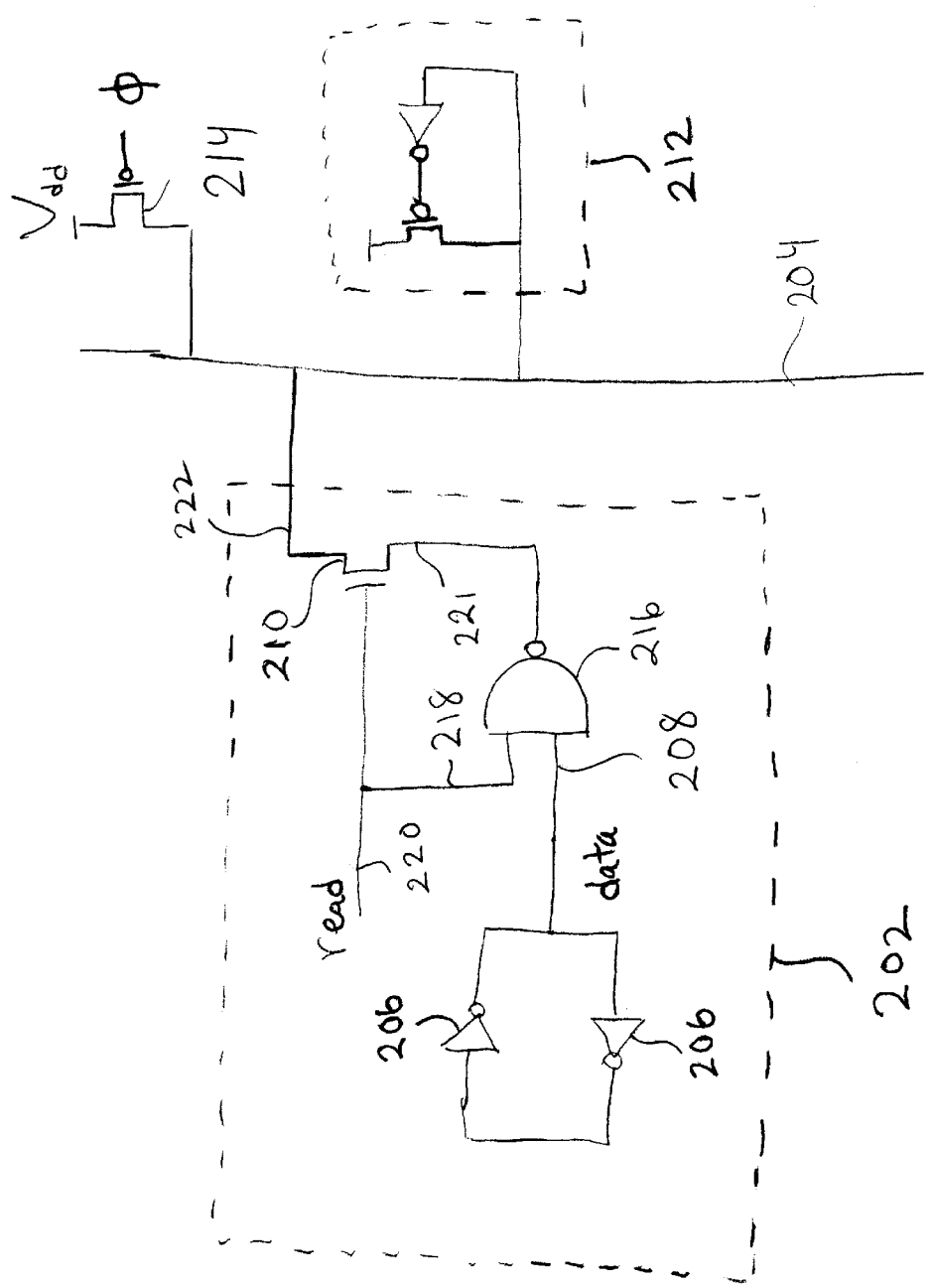
FIG. 2 is a cache memory cell according to an embodiment of the present invention.

Shown in FIG. 2 is an embodiment according to the present invention, where for simplicity only one local bit line (local bit line 204) is shown, and only one memory cell (memory cell 202) is shown connected to local bit line 204. For simplicity, a write port is not explicitly shown. Cross-coupled inverters 206 form a static circuit to store a logical state (data), and this static circuit is connected to input port 208 of NAND gate 216. For convenience, the data value stored in memory cell 202 is taken as the logical value on input port 208 of NAND gate 216, where a logical "1" corresponds to a HIGH voltage and a logical "0" corresponds to a LOW voltage. Input port 218 of NAND gate 216 and the gate of read-access transistor 210 are driven by a read-select signal on read port 220, where read port 220 is connected to input port 218 and the gate of read-access transistor 210. The read-select signal is a dynamic signal, so that it is LOW during a pre-charge phase when clock signal φ is LOW. During a pre-charge phase, pullup transistor 214 charges local bit line 204 HIGH to $V_{dd}$. During an evaluation phase, pullup transistor 214 is OFF and half-keeper 212 maintains local bit line 204 HIGH if it is not otherwise pulled LOW.

Terminal (node) 221 will be referred to as a source/drain terminal. Using the convention that the source of a nMOSFET is at a smaller voltage that its drain, it is seen that a terminal may at times be a source and at other times may be a drain. For example, in FIG. 2, terminal 221 is a source if its voltage is less than the voltage of local bit line 204. It is expected that for a majority of time for which the memory cell of FIG. 2 is operative, this is indeed the case, so that terminal 221 is usually a source. However, it may happen that local bit line 204 is discharged to a voltage less than the voltage at terminal 221, in which case terminal 221 is a drain.

During a pre-charge phase, with the read-select signal LOW, the voltage potential of the gate of read-access transistor 210 is LOW (ground). Also, input port 218 is LOW, so that regardless of the data value stored in memory cell 202, the voltage potential of source/drain terminal (node) 221 is HIGH at $V_{dd}$. During a pre-charge phase, source/drain terminal 222 is also HIGH because local bit line 204 is charged HIGH, so that regardless of whether the source is terminal 221 or terminal 222, read-access transistor 210 is reverse biased (or strongly turned OFF) during a pre-charge phase when the read-select signal is LOW. With read-access transistor 210 reverse biased, sub-threshold leakage current is significantly reduced compared to the case in which read-access transistor 210 is not reverse biased.

In addition to being reversed-biased during a pre-charge phase when the read-select signal is LOW, read-access transistor 210 has zero drain-to-source voltage. That is, the voltages at terminals 221 and 222 are both at $V_{dd}$. This also contributes to a reduction in sub-threshold leakage current. Furthermore, for some embodiments, the body of read-access transistor 210 may be at ground potential, so that during a pre-charge phase with the read-select signal LOW, terminal 221 (and also terminal 222) are biased at a higher potential than the body of read-access transistor 210. This biasing further contributes to a reduction in sub-threshold leakage current.

If during an evaluation phase no read operation is performed on memory cell 202, then the read-select signal is LOW, and read-access transistor 210 is reverse biased when terminal 221 is a source, and consequently sub-threshold leakage current is significantly reduced as described above.

Now consider the case in which during an evaluation phase a read operation is performed on memory cell 202. The read-select signal is HIGH. If memory cell 202 stores a logical "1", then both input ports 208 and 218 to NAND gate 216 are HIGH, and the voltage potential of source/drain terminal 221 is LOW. Read-access transistor 210 is strongly turned ON and local bit line 204 is discharged LOW. (In this case, we may consider terminal 221 as the source because local bit line 204 has been charged to $V_{dd}$ before the read operation is performed and is therefore at a higher potential than terminal 221.) If memory cell 202 stores a logical "0", then input port 208 of NAND gate 216 is LOW, and the voltage potential of source/drain terminal 221 is HIGH ($V_{dd}$). Read-access transistor 210 is OFF, and memory cell 202 does not strongly discharge local bit line 204 LOW. (Note that read-access transistor 210 is OFF in this case regardless of whether the source is source/drain terminal 221 or source/drain terminal 222, for both are at potential $V_{dd}$ before the read operation.)

If memory cell 202 stores a logical "0" during a read operation, it is desired that local bit line 204 is not discharged LOW or close to LOW, otherwise, the read operation may provide an erroneous result. Read-access transistor 210 is not reverse biased during a read operation when memory cell 202 stores a logical "0", and so read-access transistor 210 may contribute to sub-threshold leakage current. However, because only one memory cell out of the set of memory cells connected to a local bit line is read at a time, the read-select signals for all other memory cells connected to local bit line 204 are LOW, and it follows that their read-access transistors are reverse biased. Consequently, the cumulative effect of the other memory cells upon discharging local bit line 204 via sub-threshold leakage current is significantly reduced.

Figure 3:
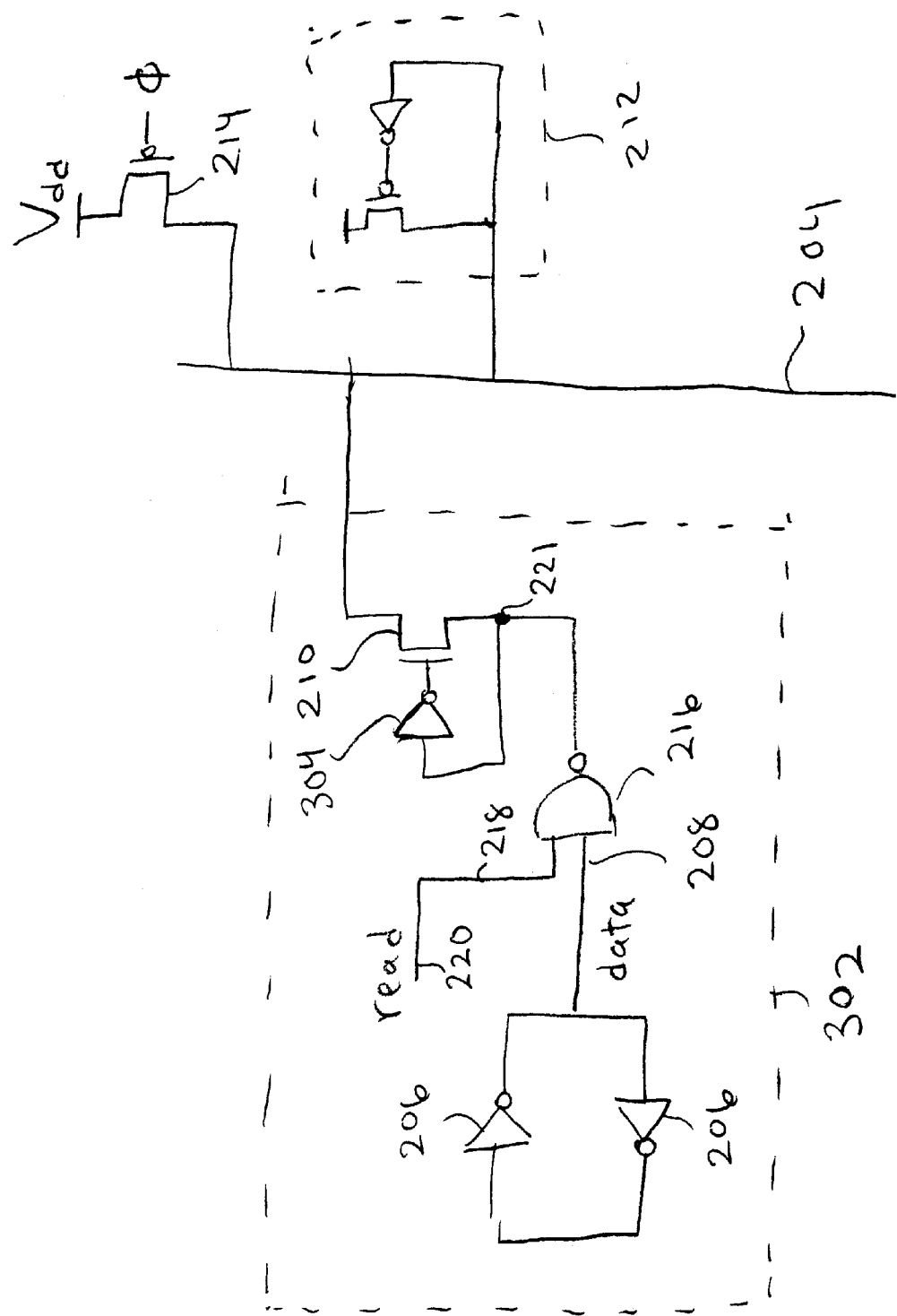
FIG. 3 is a cache memory cell according to another embodiment the present invention.

Another embodiment according to the present invention is indicated in FIG. 3, where again for simplicity, only one local bit line with only one connected memory cell is shown, and the write port is not shown. Components in FIG. 3 having a similar or identical function as components in FIG. 2 are labeled in corresponding fashion. The memory cell in FIG. 3 is similar to that of FIG. 2, but inverter 304 connects the source/drain terminal (node) 221 of read-access transistor 210 to its gate, and read port 220 is connected to input port 218 of NAND gate 216 but not to the gate of read-access transistor 210. In this way, the fan-in capacitance seen by the read-select signal is reduced compared to the embodiment of FIG. 2 for the same device size.

During a pre-charge phase, pullup transistor 214 charges local bit line 204 HIGH, and the read-select signal is LOW. With the read-select signal LOW, node 221 is HIGH ($V_{dd}$) and the gate of read-access transistor 210 is LOW, so that read-access transistor 210 is reverse biased. During an evaluation phase in which a read operation is not performed on memory cell 302, the read-select signal is LOW, so that again read-access transistor 210 is reverse biased. Thus, sub-threshold leakage current is significantly reduced during a pre-charge phase, and also during an evaluation phase when no read operation is being performed, as described with respect to the embodiment of FIG. 2.

As discussed with respect to FIG. 2, read-access transistor 210 for the embodiment of FIG. 3 has zero drain-to-source voltage during a pre-charge phase when the read-select signal is LOW. Furthermore, as for FIG. 2, for those embodiments of FIG. 3 in which the body of read-access transistor 210 is at ground potential, during a pre-charge phase when the read-select signal is LOW, read-access transistor 210 is biased so that its source is at a higher potential than its body. These effects also contribute to reducing sub-threshold leakage current.

Various modifications may be made to the described embodiments without departing from the scope of the invention as claimed below.

What is claimed is:

1. A memory comprising:
   a local bit line; and
   a memory cell comprising:
      a read port;
      a read-access transistor having a first source/drain connected to the local bit line, and having a second source/drain and a gate;
      a NAND gate having an output port connected to the second source/drain of the read-access transistor, having a first input port connected to the read port, and having a second input port; and
      a static circuit to store a logical state;
      wherein the second input port of the NAND gate is coupled to the static circuit, the second input port of the NAND gate having a voltage responsive to the stored logical state.

2. The memory as set forth in claim 1, wherein the first input port of the NAND gate is connected to the gate of the read-access transistor.

3. The memory as set forth in claim 1, further comprising:
   an inverter having an input port connected to the second source/drain of the read-access transistor and having an output port connected to the gate of the read-access transistor.

4. A memory cell comprising:
   a read port;
   a read-access transistor having a source/drain and a gate; and
   a NAND gate having an output port connected to the source/drain of the read-access transistor, having a first input port connected to the read port, and having a second input port; and
   a static circuit to store a logical state;
   wherein the second input port of the NAND gate is coupled to the static circuit, the second input port of the NAND gate having a voltage responsive to the stored logical state.

5. The memory cell as set forth in claim 4, wherein the first input port of the NAND gate is connected to the gate of the read-access transistor.

6. The memory cell as set forth in claim 4, further comprising:
   an inverter having an input port connected to the source/drain of the read-access transistor and having an output port connected to the gate of the read-access transistor.

* * * * *